United States Patent
Kono

(10) Patent No.: US 9,929,173 B2
(45) Date of Patent: *Mar. 27, 2018

(54) METHOD OF CONTROLLING A SEMICONDUCTOR MEMORY DEVICE

(71) Applicant: TOSHIBA MEMORY CORPORATION, Minato-ku (JP)

(72) Inventor: Fumihiro Kono, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/331,026

(22) Filed: Oct. 21, 2016

(65) Prior Publication Data

US 2017/0040341 A1    Feb. 9, 2017

Related U.S. Application Data

(63) Continuation of application No. 15/007,880, filed on Jan. 27, 2016, now Pat. No. 9,508,740, which is a (Continued)

(30) Foreign Application Priority Data

Jun. 17, 2011    (JP) ................................. 2011-135093

(51) Int. Cl.
*G11C 5/06* (2006.01)
*H01L 27/11582* (2017.01)
(Continued)

(52) U.S. Cl.
CPC ........ *H01L 27/11582* (2013.01); *G11C 5/025* (2013.01); *G11C 16/0483* (2013.01); (Continued)

(58) Field of Classification Search
CPC ....... G11C 5/025; G11C 2213/71; G11C 5/02; G11C 5/06; G11C 16/0408; G11C 7/18; (Continued)

(56) References Cited

U.S. PATENT DOCUMENTS 5,903,492 A    5/1999  Takashima
6,727,544 B2   4/2004  Endoh et al.
(Continued)

FOREIGN PATENT DOCUMENTS

JP    10-255483      9/1998
JP    2003-7868 A    1/2003
(Continued)

OTHER PUBLICATIONS

US 8,076,665, 12/2011, Futatsuyama (withdrawn)
Office Actin dated Jun. 24, 2014 in Japanese Patent Application No. 2011-135093 with English translation.

*Primary Examiner* — David Lam
(74) *Attorney, Agent, or Firm* — Oblon, McClelland, Maier & Neustadt, L.L.P.

(57) ABSTRACT

According to an embodiment, a semiconductor memory device comprises: a semiconductor substrate; a memory cell array configured having a plurality of memory units, each of the memory units including a plurality of memory cells connected in series, the plurality of memory cells being stacked, the plurality of memory units involving a first memory unit and a second memory unit; and a plurality of bit lines connected to ends of each of the memory units in the memory cell array. The first memory unit and the second memory unit are arranged in a staggered manner by the first memory unit being displaced in a row direction with respect to the second memory unit by an amount less than an arrangement pitch in a row direction of the first memory unit or the second memory unit.

33 Claims, 12 Drawing Sheets

Related U.S. Application Data continuation of application No. 14/307,196, filed on Jun. 17, 2014, now Pat. No. 9,281,016, which is a continuation of application No. 13/524,750, filed on Jun. 15, 2012, now Pat. No. 8,787,061.

(51) Int. Cl.

| | | |
|---|---|---|
| *G11C 16/26* | (2006.01) | |
| *H01L 27/11551* | (2017.01) | |
| *G11C 5/02* | (2006.01) | |
| *G11C 16/04* | (2006.01) | |
| *H01L 27/11568* | (2017.01) | |
| *H01L 23/498* | (2006.01) | |
| *H01L 27/11578* | (2017.01) | |

(52) U.S. Cl.
CPC ............ *G11C 16/26* (2013.01); *H01L 23/498* (2013.01); *H01L 23/49827* (2013.01); *H01L 23/49838* (2013.01); *H01L 27/11551* (2013.01); *H01L 27/11568* (2013.01); *G11C 2213/71* (2013.01); *H01L 27/11578* (2013.01)

(58) Field of Classification Search
CPC ............... G11C 16/26; G11C 16/0483; H01L 27/11582; H01L 27/11551; H01L 23/528; H01L 27/0207; H01L 23/49827; H01L 23/498; H01L 23/49838; H01L 27/11568; H01L 27/11578
USPC .............. 365/63, 51, 230.06, 185.11, 230.03
See application file for complete search history.

(56) References Cited

U.S. PATENT DOCUMENTS

| | | | |
|---|---|---|---|
| 7,539,056 B2 | 5/2009 | Katsumata et al. | |
| 7,936,004 B2 | 5/2011 | Kito et al. | |
| 7,952,904 B2 | 5/2011 | Zhang | |
| 8,081,516 B2 | 12/2011 | Lee et al. | |
| 8,169,809 B2 | 5/2012 | Stipe | |
| 8,406,034 B2 * | 3/2013 | Murooka | G11C 5/063 365/148 |
| 8,503,213 B2 * | 8/2013 | Chen | H01L 27/11573 365/148 |
| 8,787,061 B2 * | 7/2014 | Kono | G11C 5/025 365/230.06 |
| 8,797,777 B2 | 8/2014 | Hishida et al. | |
| 9,281,016 B2 * | 3/2016 | Kono | G11C 5/025 |
| 9,508,740 B2 * | 11/2016 | Kono | G11C 5/025 |
| 2007/0252201 A1 | 11/2007 | Kito et al. | |
| 2009/0090959 A1 | 4/2009 | Nishihara et al. | |
| 2010/0090188 A1 | 4/2010 | Futatsuyama | |
| 2010/0172183 A1 | 7/2010 | Lue et al. | |

FOREIGN PATENT DOCUMENTS

| | | |
|---|---|---|
| JP | 2007-266143 | 10/2007 |
| JP | 2008-192708 | 8/2008 |
| JP | 2010-8067 | 4/2010 |
| JP | 2011-3642 A | 1/2011 |
| JP | 2011-35169 A | 2/2011 |

* cited by examiner

US 9,929,173 B2

METHOD OF CONTROLLING A SEMICONDUCTOR MEMORY DEVICE

CROSS-REFERENCE TO RELATED APPLICATIONS

This application is a continuation of and claims the benefit of priority under 35 U.S.C. § 120 from U.S. application Ser. No. 15/007,880, filed Jan. 27, 2016 which is a continuation of U.S. application Ser. No. 14/307,196, filed Jun. 17, 2014 (now U.S. Pat. No. 9,281,016) which is a continuation of U.S. application Ser. No. 13/524,750, filed Jun. 15, 2012 (now U.S. Pat. No. 8,787,061), and is based upon and claims the benefit of priority from the prior Japanese Patent Application No. 2011-135093, filed on Jun. 17, 2011, the entire contents of each of which are incorporated herein by reference.

FIELD

The embodiments described herein relate to a semiconductor memory device.

BACKGROUND

Description of the Related Art

In recent years, several semiconductor memory devices having memory cells disposed three-dimensionally (stacked type semiconductor memory devices) have been proposed to increase the degree of integration of memory.

In one known example of such a stacked type semiconductor memory device, semiconductor pillars are formed extending in a perpendicular direction with respect to a semiconductor substrate, and word lines disposed in multiple layers in the perpendicular direction are connected to side surfaces of those semiconductor pillars via charge storage layers, thereby configuring a memory cell unit having memory cells connected in series in the perpendicular direction. The semiconductor pillars are disposed in a matrix in a column direction and a row direction on the semiconductor substrate, and bit lines are disposed along the semiconductor pillars aligned in the column direction. The charge storage layers are formed continuously along the side surfaces of the semiconductor pillars, hence manufacture is easy and appropriate for increasing integration. Improvements in manufacturing technology are expected to result in further improvements in performance due to miniaturization in this kind of stacked type semiconductor device.

DETAILED DESCRIPTION

A semiconductor memory device according to an embodiment comprises: a semiconductor substrate; a memory cell array configured having a plurality of memory units; and a plurality of bit lines connected to ends of each of the memory units in the memory cell array. Each of the memory units include a plurality of memory cells connected in series. The plurality of memory cells are stacked. The plurality of memory units involve a first memory unit and the second memory unit. The plurality of bit lines involving a first bit line and a second bit line which is adjacent to the first bit line. The first bit line is connected to the first memory unit, and the second bit line is connected to the second memory unit. The first memory unit and the second memory unit are arranged in a staggered manner by the first memory unit being displaced in a row direction with respect to the second memory unit by an amount less than an arrangement pitch in a row direction of the first memory unit or the second memory unit.

Embodiments of the semiconductor memory device are described below with reference to the drawings.

[First Embodiment]
[Overall Configuration]

Figure 1:
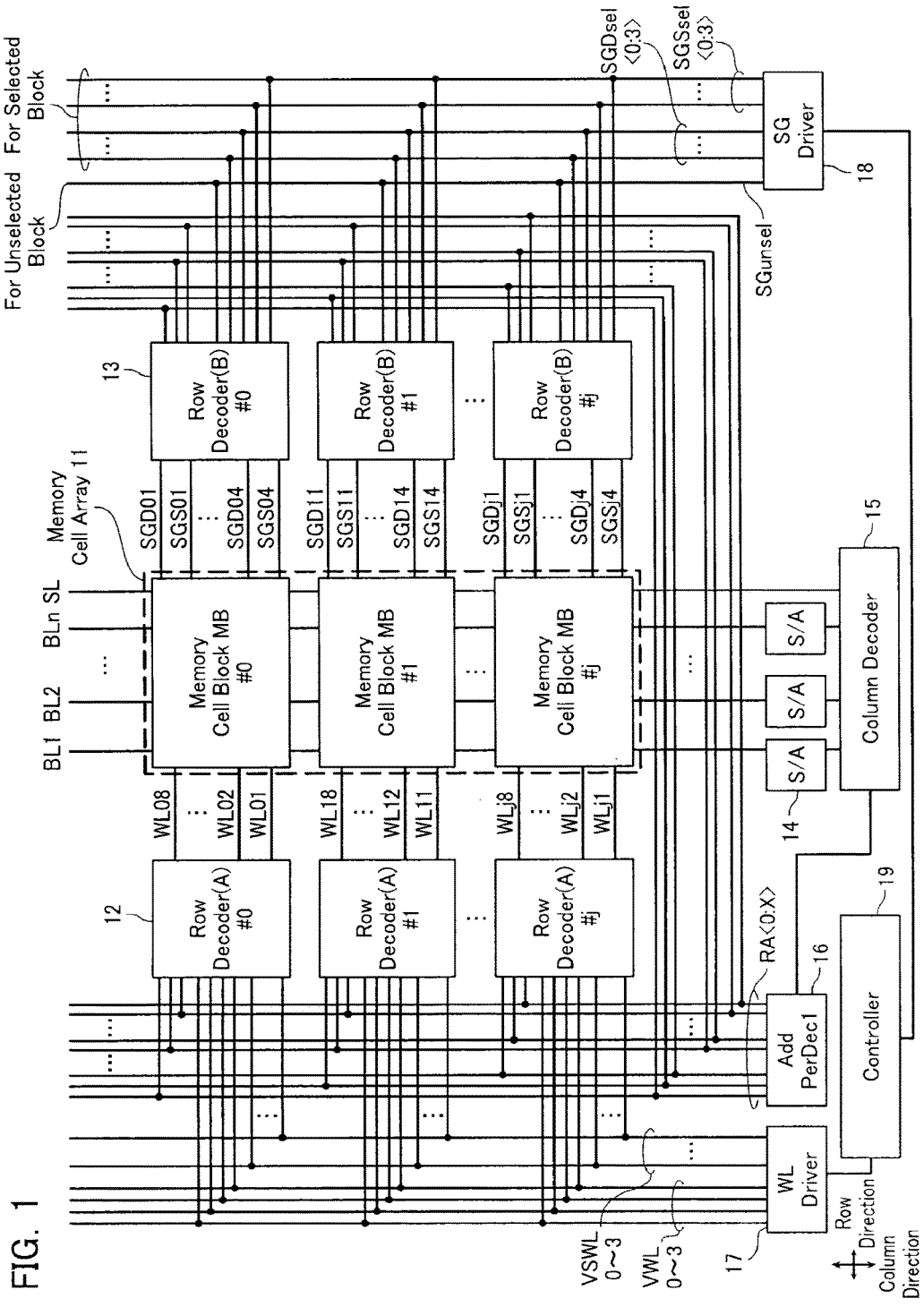
FIG. 1 is a block diagram showing a configuration of a semiconductor memory device according to a first embodiment.

First, an overall configuration of a semiconductor memory device according to a first embodiment is described with reference to FIG. 1. FIG. 1 is a block diagram showing the configuration of the semiconductor memory device according to the first embodiment.

As shown in FIG. 1, the semiconductor memory device according to the first embodiment includes a memory cell array 11 that comprises a plurality of memory blocks MB. The plurality of memory blocks MB#0-#j are aligned in a column direction (direction in which bit lines BL extend). The memory blocks MB#0-#j are connected to the bit lines BL1-BLn and a source line SL. All the memory blocks MB#0-#j share the bit lines BL1-BLn and the source line SL. The plurality of memory blocks MB#0-#j are connected to a plurality of word lines WL and a plurality of select gate lines SGD and SGS extending in a row direction. The word lines WL are connected to a row decoder 12, and the select gate lines SGD and SGS are connected to a row decoder 13. Moreover, the bit lines BL are connected to a column decoder 15 via a sense amplifier 14.

The row decoder 12 selects the word lines WL based on a row address outputted from an address pre-decoder 16. The row decoder 12 transfers a voltage generated by a word line driver 17 to, respectively, a selected word line WL and an unselected word line WL.

Figure 2:
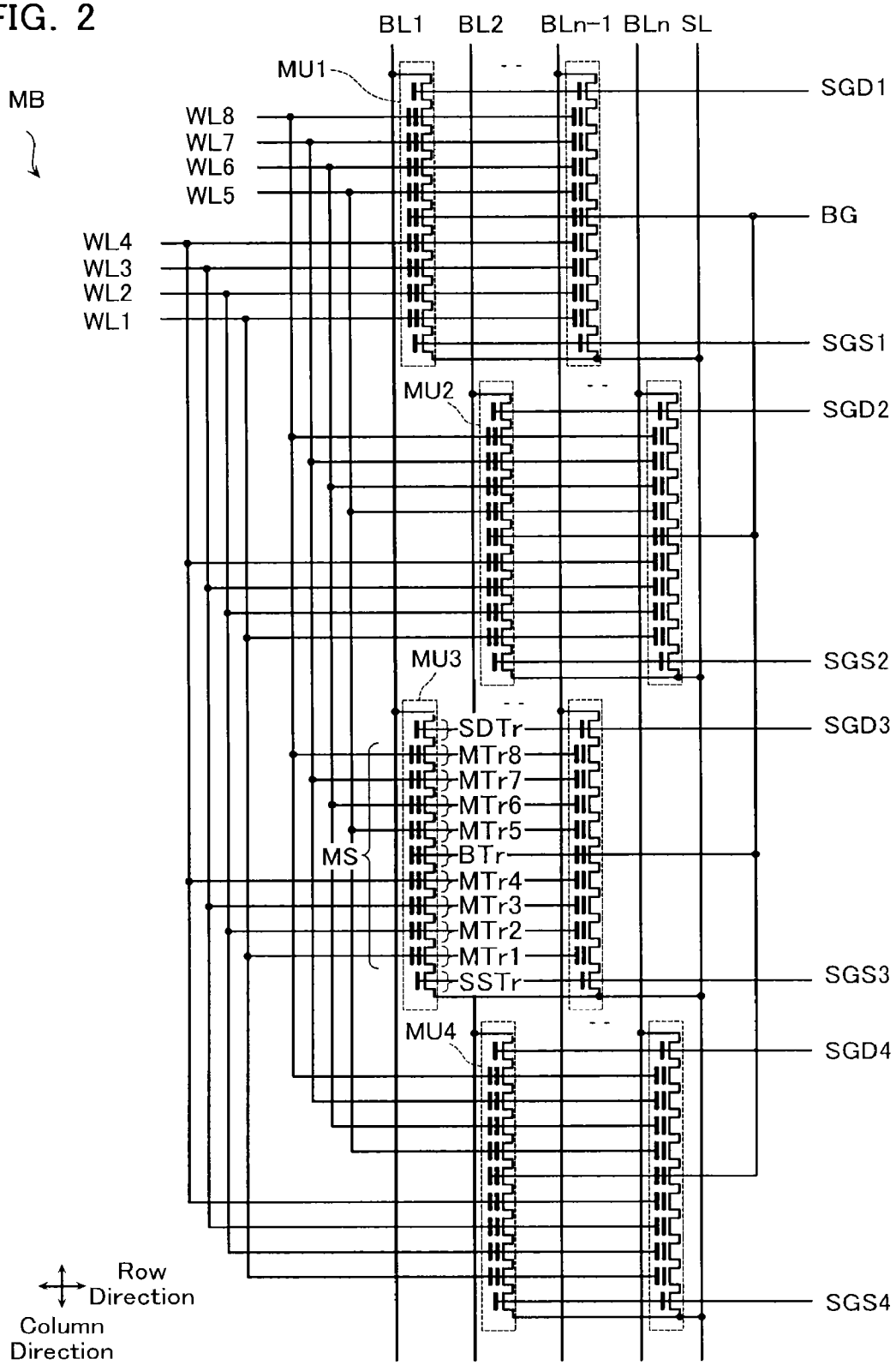
FIG. 2 is a circuit diagram of part of a memory cell array in the semiconductor memory device according to same embodiment.

The row decoder 13 selects a source side select gate line SGS and a drain side select gate line SGD corresponding to a memory unit MU shown in FIG. 2 activated based on the row address outputted from the address pre-decoder 16. The row decoder 13 transfers a gate voltage generated by a select gate line driver 18 to a selected source side select gate line SGS and drain side select gate line SGD.

The column decoder 15 decodes a column address signal outputted from the address pre-decoder 16 and performs input/output control of data. The sense amplifier 14 senses and latches data of the bit line BL selected by the column decoder 15. A controller 19 receives a signal for executing a read/write/erase operation and so on, from an address command register not illustrated, and controls an internal voltage generating circuit not illustrated that generates various voltages required in core operation, according to a certain sequence. Note that a peripheral circuit of the row decoders 12 and 13, the sense amplifier 14, the column decoder 15, and so on, may be formed directly below the memory cell array 11.

[Memory Cell Array]

Next, a configuration of the memory cell array 11 is described with reference to FIGS. 2-5. FIG. 2 is a circuit diagram showing part of one memory block MB in the memory cell array 11.

As shown in FIG. 2, the memory block MB includes a plurality of memory units MU. These memory units MU are arranged in a matrix and arranged staggered in the column direction.

One ends of the memory units MU are connected alternately to two bit lines BLj and BLj+1 disposed along these memory units MU. Specifically, an example is described of the memory units MU (MU1-MU4) connected to the bit lines BL1 and BL2. The memory units MU1-MU4 are arranged staggered in the column direction.

One end of the memory unit MU1 is connected to the bit line BL1. One end of the memory unit MU2 which is misaligned in the row direction with respect to the memory unit MU1 is connected to the bit line BL2. Similarly, one end of the memory unit MU3 having the same row direction as the memory unit MU1 is connected to the bit line BL1. One end of the memory unit MU4 which is misaligned in the row direction with respect to the memory unit MU3 is connected to the bit line BL2.

Other ends of each of the memory units MU are commonly connected to the source line SL.

Each of the memory units MU includes a memory string MS configured from a plurality of memory transistors MTr1-MTr8 connected in series and a back gate transistor BTr connected between the memory transistors MTr4 and MTr5, and, at the two ends of the memory string MS, a source side select transistor SSTr and a drain side select transistor SDTr. The memory transistors MTr1-MTr8 each have a MONOS structure, for example, that includes: a charge storage layer (for example, an insulating film) formed on a side surface of a semiconductor body via a gate insulating film; an insulating film (insulating film having a higher permittivity than the charge storage layer) formed on a side surface of the charge storage layer; and a control gate formed on a side surface of this insulating film. The memory transistors MTr1-MTr8 each change their threshold voltage by storing a charge in their charge storage layer. As a result, the memory transistors MTr1-MTr8 each store information corresponding to this threshold voltage.

In the memory block MB, gates of memory transistors MTrj aligned in the row direction are commonly connected to a word line WLj extending in the row direction. In addition, in one memory block MB, word lines WLj connected to corresponding memory transistors MTrj in each of the memory units MU are commonly connected. Moreover, gates of back gate transistors BTr in the memory units MU are commonly connected to the back gate line BG.

In the memory block MB, gates of each of the drain side select transistors SDTr aligned in the row direction are commonly connected to the drain side select gate line SGD extending in the row direction. Moreover, in the memory block MB, gates of each of the source side select transistors SSTr aligned in the row direction are commonly connected to the source side select gate line SGS extending in the row direction.

Next, a structure of the memory cell array 11 according to the first embodiment is described with reference to FIGS. 3-5.

Figure 3:
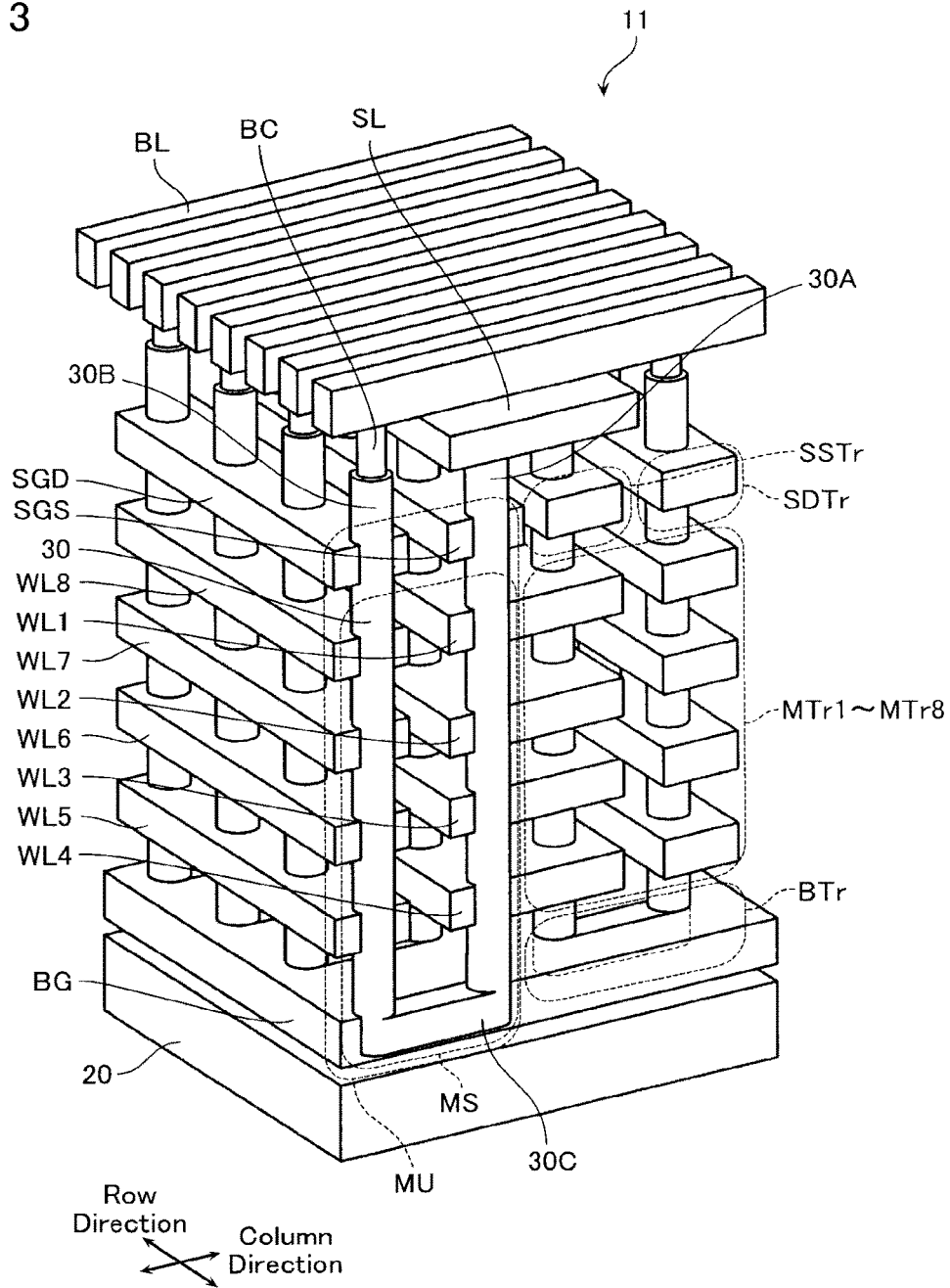
FIG. 3 is a perspective view of part of the memory cell array in the semiconductor memory device according to same embodiment.
Figure 4:
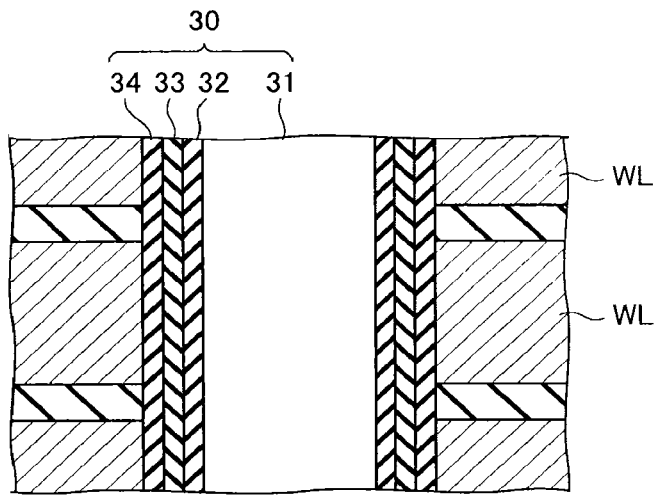
FIG. 4 is a cross-sectional view of part of the memory cell array in the semiconductor memory device according to same embodiment.

FIG. 3 is a perspective view showing a configuration of part of the memory cell array 11.

As shown in FIG. 3, the memory cell array 11 is configured comprising a U-shaped pillar semiconductor layer 30 having both ends (source end and drain end) extending upwardly in a perpendicular direction on a semiconductor substrate 20, with the back gate transistor BTr as a folded part. The semiconductor layer 30 is disposed having its both ends (upper ends) aligned in the column direction, and is disposed in plurality in a matrix in the column direction and the row direction. As shown in an enlarged view of part of a cross-section of the semiconductor layer 30 in FIG. 4, the semiconductor layer 30 is configured by a pillar semiconductor body 31, a tunnel insulating layer 32 covering a side surface of the semiconductor body 31, a charge storage layer 33, and a block insulating layer 34. Employable as the tunnel insulating layer 32 and the block insulating layer 34 is, for example, silicon oxide ($SiO_2$) or the like. Employable as the charge storage layer 33 is, for example, silicon nitride (SiN) or the like.

A back gate BG is disposed on the semiconductor substrate 20. The back gate transistor BTr is formed by this back gate BG and the folded part of the semiconductor layer 30. The folded part herein is described using FIG. 3. The semiconductor layer 30 includes a first pillar portion 30A, a second pillar portion 30B, and a folded portion 30C. The folded part refers to this 30C in FIG. 3.

Stacked around the first pillar portion 30A, via insulating layers, in order from the semiconductor substrate 20 side in an upwardly perpendicular direction, are conductive layers forming the word lines WL4, WL3, WL2, WL1, and the source side select gate line SGS. These conductive layers are connected to a side surface of the semiconductor layer 30. Stacked around the second pillar portion 30B, via insulating layers, in order from the semiconductor substrate 20 side in an upwardly perpendicular direction, are conductive layers forming the word lines WL5, WL6, WL7, WL8, and the drain side select gate line SGD. These conductive layers are connected to a side surface of the semiconductor layer 30. As a result, the memory transistors MTr1-8 are formed having the word lines WL1-8 as control gates, and the U-shaped semiconductor body 31 as a channel body. In addition, the source side select gate line SGS, the drain side select gate line SGD, and the back gate BG have the U-shaped semiconductor layer 30 as a body to configure, respectively, the source side select gate transistor SSTr, the drain side select gate transistor SDTr, and the back gate transistor BTr.

That is, the memory transistors MTr1-8 and the back gate transistor BTr configure the memory string MS, having a stacking direction as a long direction. Moreover, the memory string MS, the drain side select gate transistor SDTr, and the source side select gate transistor SSTr configure the memory unit MU. A source side of the memory unit MU, that is, one of the ends of the semiconductor layer 30, is connected to the source line SL. A drain side of the memory unit MU, that is, the other of the ends of the semiconductor layer 30, is connected to the bit line BL via a bit line contact BC. The bit line BL and the bit line contact BC are formed thinner than the semiconductor layer 30.

Figure 5:
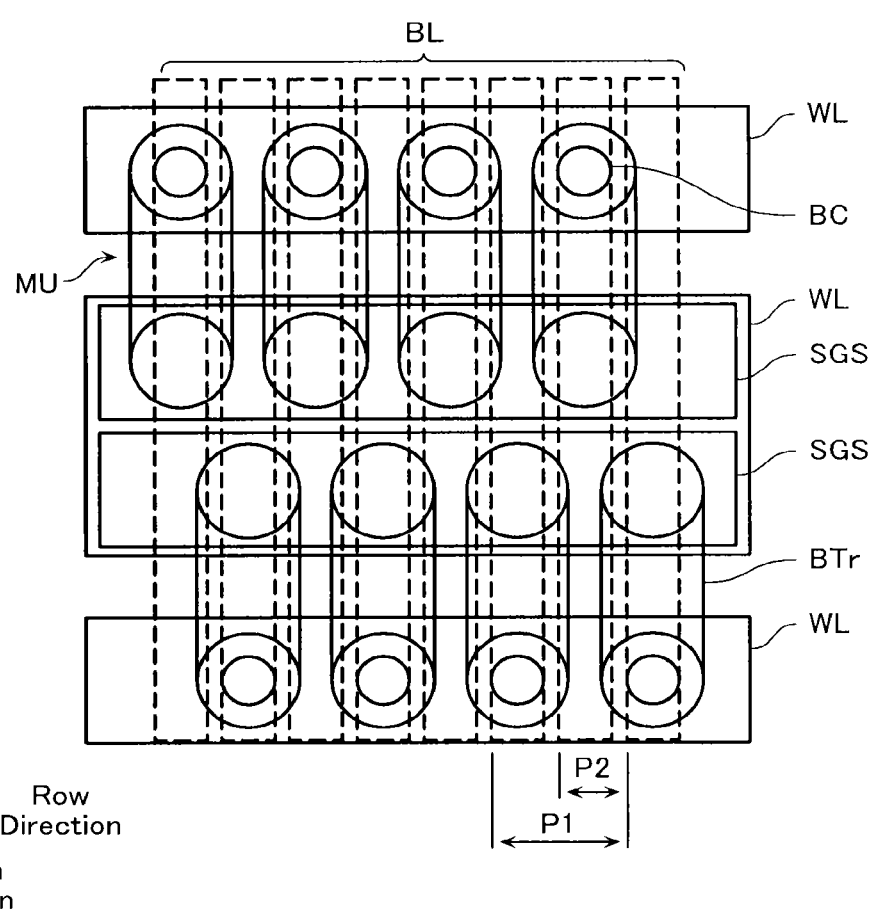
FIG. 5 is a plan view of part of the memory cell array in the semiconductor memory device according to same embodiment.

FIG. 5 is a plan view showing a configuration of part of the memory cell array.

As shown in FIG. 5, in the semiconductor memory device according to the present embodiment, the memory units MU are disposed in a staggered manner. That is, the memory units MU adjacent in the row direction are disposed with a spacing of a pitch P1, and the memory units MU adjacent in the column direction are disposed at positions shifted with respect to each other in the row direction by an increment of a half pitch P2 (half of the pitch P1). In addition, the bit lines BL are arranged in the row direction with the pitch P2. Therefore, the memory units MU adjacent in the column direction are respectively connected to different bit lines BL.

Figure 6:
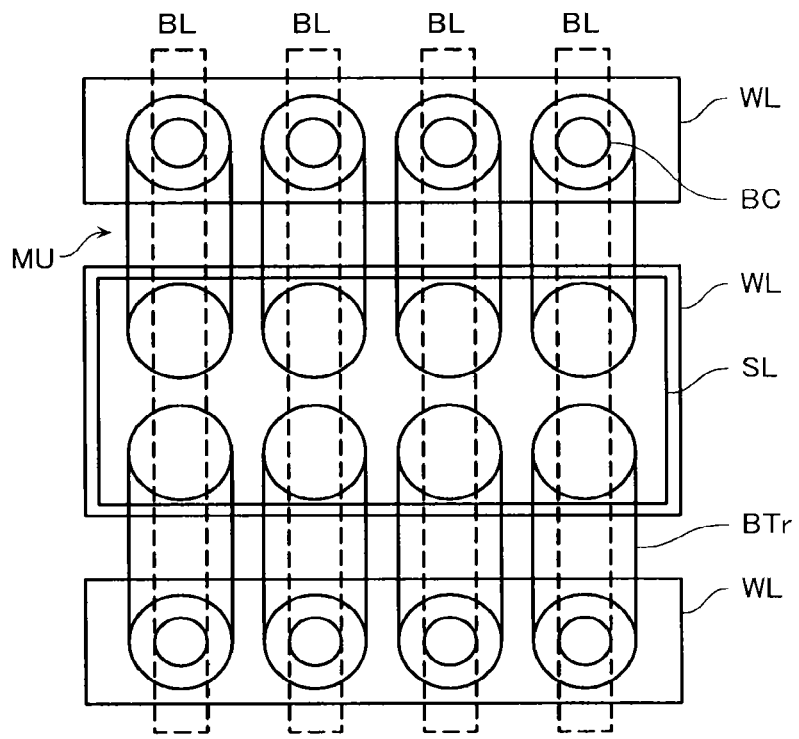
FIG. 6 is a plan view of part of a memory cell array in a semiconductor memory device according to a comparative example.

As a comparative example, FIG. 6 shows a plan view of a general semiconductor memory device. In the comparative example, a pitch in the row direction of the bit lines BL and the memory units MU is configured equal.

The memory unit MU is formed in a memory hole. The memory hole is formed deeply in the stacking direction in the word lines WL and insulating layers. Moreover, the memory unit MU has the semiconductor layer formed having a charge storage layer and insulating layer formed on its surface. Hence, miniaturization of the memory unit MU is not as easy as for the bit line BL. In contrast, the bit line BL can be lithographed by simple line-and-spacing, hence further miniaturization can be realized easily by, for example, a sidewall transfer process. Specifically, the bit line BL can be formed with a width of about 1/n times the width of the semiconductor layer 30 (where n is a natural number).

Focusing on this point, as shown in FIG. 5, the semiconductor memory device according to the present embodiment, by having the memory units MU disposed in a staggered manner and having the pitch P2 in the row direction of the bit lines BL set to ½ of the pitch P1 of the memory units MU, enables simultaneous access to two times the number of bit lines BL as in the comparative example.

As described above, the present embodiment has twice the number of bit lines BL connected to the same number of memory units MU as in the comparative example. Therefore, the present embodiment, by simultaneously selecting the select transistors SDTr and SSTr in the memory units MU respectively connected to different adjacent bit lines, for example, connected to BL1 and BL2 by the row decoder 13 shown in FIG. 1, results in data number capable of being read or written in a single read operation (page length) being two times that of a conventional example and thereby enables read speed to be dramatically improved. As a result, although conventionally it was required to arrange additional memory units MU in the word line WL direction to increase page length, the present embodiment allows page length to be increased without increasing circuit area.

Figure 7:
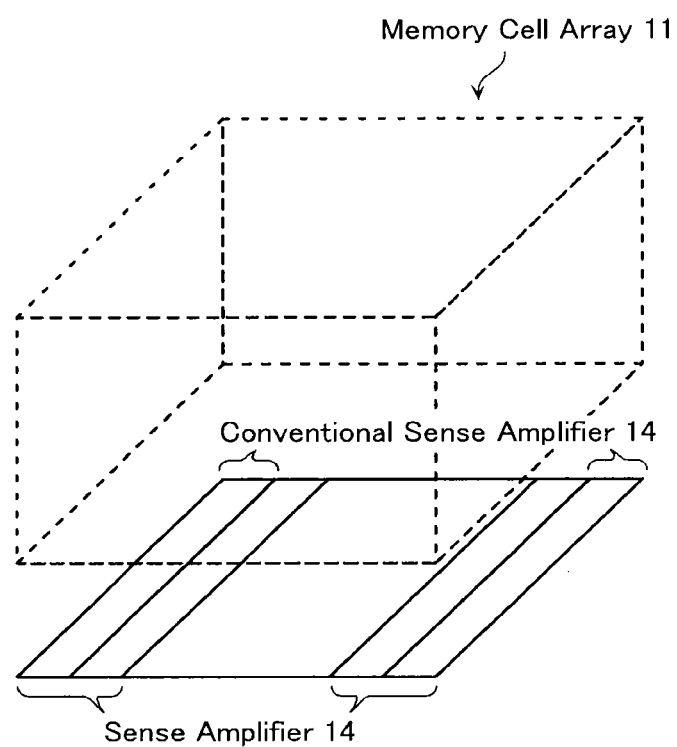
FIG. 7 is a schematic perspective view showing part of the semiconductor memory device according to same embodiment.

Note that since the bit lines BL are connected to the sense amplifier 14, there is a risk that increasing the number of bit lines leads to an increase in circuit area. However, the semiconductor memory device according to the present embodiment is a semiconductor memory device of the so-called Pipe type employing the U-shaped semiconductor layer 30 as a channel body of the memory unit MU. Hence, it is possible to bring the wiring together above the memory cell array 11 and form the sense amplifier 14 under the memory cell array 11 as shown in FIG. 7. Therefore, circuit area is determined by area of the memory cell array 11, and it can be prevented that circuit area increases to be larger than area of the memory cell array 11.

[Second Embodiment]

Figure 8:
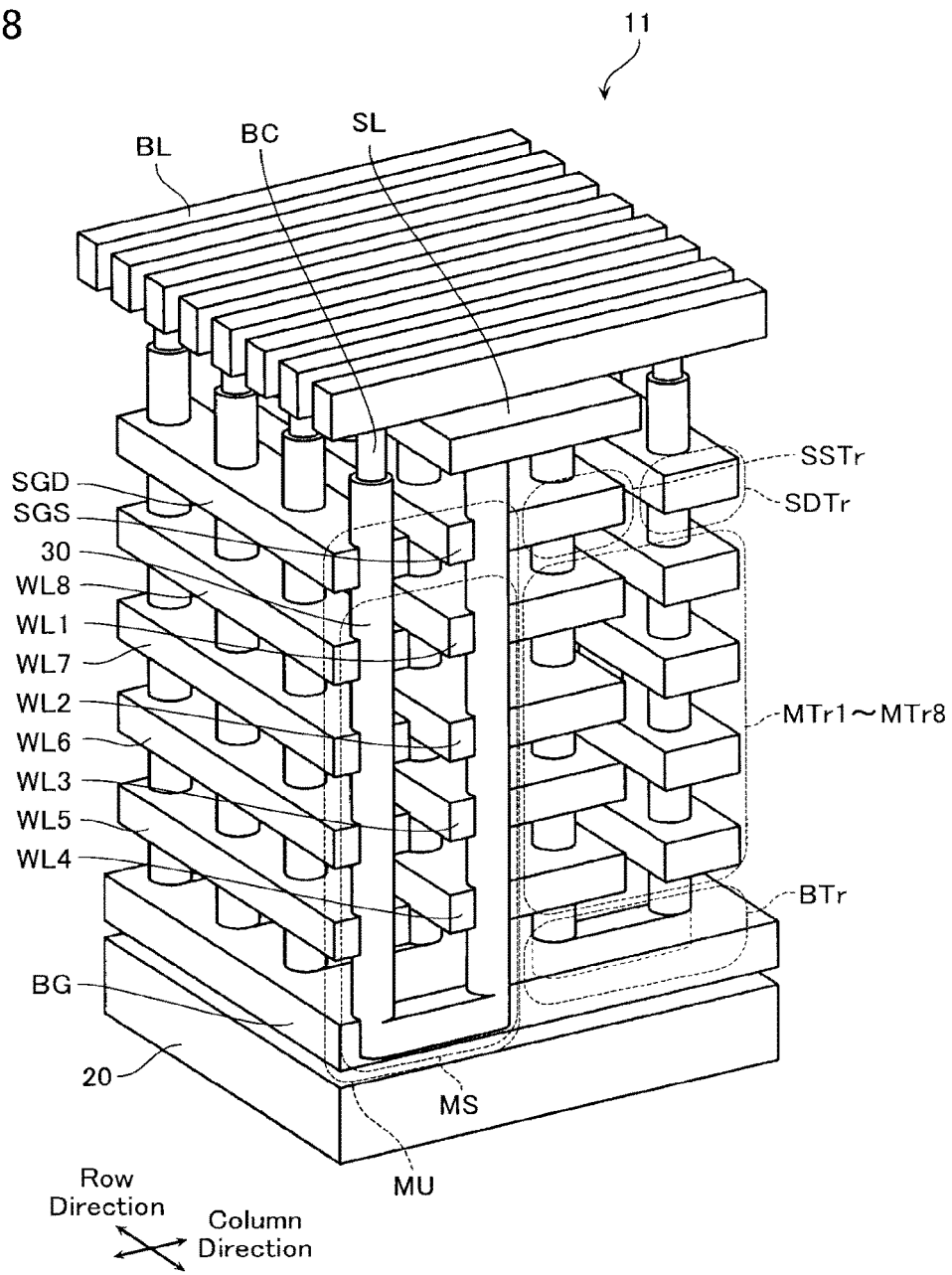
FIG. 8 is a perspective view of part of a memory cell array in a semiconductor memory device according to a second embodiment.
Figure 9:
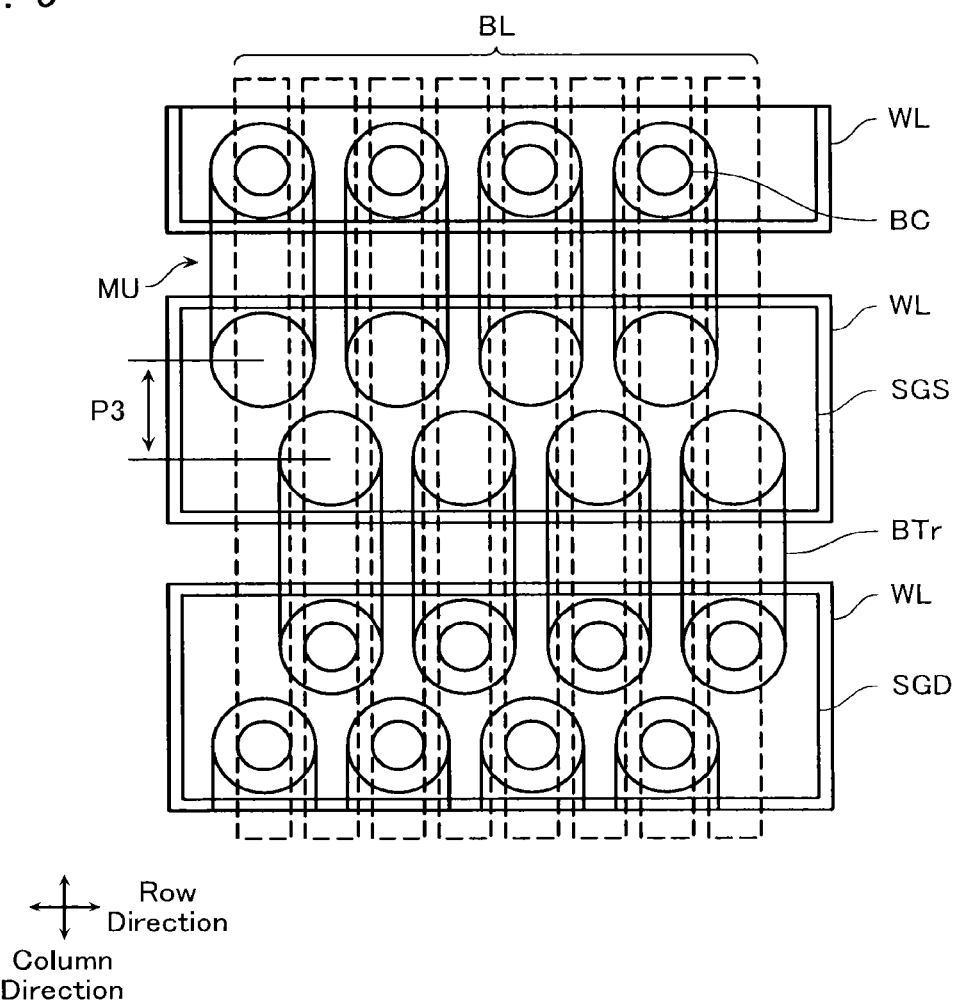
FIG. 9 is a plan view of part of the memory cell array in the semiconductor memory device according to same embodiment.
Figure 10:
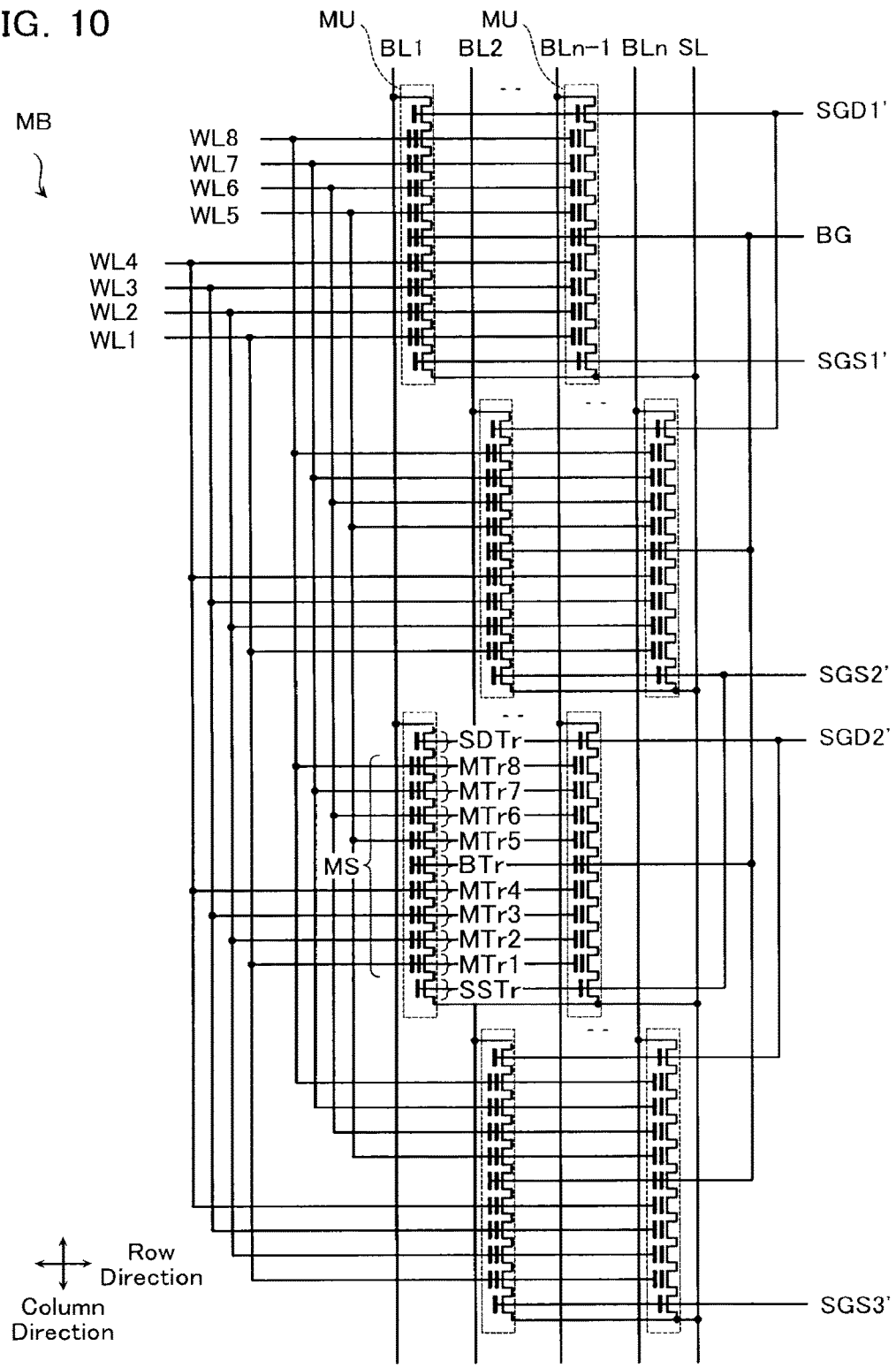
FIG. 10 is a circuit diagram of part of the memory cell array in the semiconductor memory device according to same embodiment.

Next, a configuration of a semiconductor memory device according to a second embodiment is described with reference to FIGS. 8-10. FIG. 8 is a perspective view showing a configuration of part of a memory cell array 11 according to the second embodiment; FIG. 9 is a plan view of same memory cell array 11; and FIG. 10 is a circuit diagram of same memory cell array 11. Note that identical symbols are assigned to configurations identical to those in the first embodiment, and descriptions thereof are omitted.

The present embodiment differs from the first embodiment in having the source side select gate line SGS and the drain side select gate line SGD shared between the memory units MU adjacent in the column direction. That is, focusing on a certain memory unit MU shown in FIG. 9, the memory units MU disposed to one side of this certain memory unit MU in the column direction share with the certain memory unit MU, for example, the source side select gate line SGS, and the memory units MU disposed to the other side of this certain memory unit MU in the column direction share with the certain memory unit MU, for example, the drain side select gate line SGD.

Accordingly, as shown in FIG. 10 for example, in the second embodiment, the drain side select gate lines SGD1 and SGD2 in the first embodiment shown in FIG. 2 are commonly connected to become a drain side select gate line SGD1'. Similarly, in the second embodiment, the source side select gate lines SGS2 and SGS3 in the first embodiment shown in FIG. 2 are commonly connected to become a source side select gate line SGS2'. Activating the drain side select gate line SGD1' and the source side select gate lines SGS1' and SGS2' results in n bits of data being simultaneously accessed from the upper two columns of memory units MU in FIG. 10 via the bit lines BL1-BLn.

As shown in FIG. 9, the second embodiment allows a spacing of the memory units MU adjacent in the column direction to be narrowed as shown by P3 in FIG. 9, more than in the first embodiment where the select gates SGS and SGD of the memory units adjacent in the column direction are each provided independently. That is, in the present embodiment, the spacing between the memory units MU in the column direction is smaller than a spacing between the memory units in the row direction. As a result, in the second embodiment, the word lines WL can be miniaturized compared with the conventional example. In other words, a length in the column direction of the plurality of word lines WL is smaller than a sum of two closest distances in the column direction from sides of the semiconductors 30 to both ends of the word lines WL, two diameter's worth of the semiconductor 30, and a spacing between the semiconductors 30 adjacent in the column direction. In a structure where a plurality of plate-shaped word lines WL are stacked as in the present embodiment, parasitic capacitance is generated between the word lines WL overlapping in the stacking direction. However, in the present embodiment, narrowing the spacing between the memory units MU allows this parasitic capacitance to be reduced, thereby leading to increased power consumption saving and speeding up of operations. In addition, the fact that the word lines WL are capable of being miniaturized allows a dimension in the column direction of the memory cell array 11 to be shortened, and a length in the column direction of the bit lines BL also to be shortened. This too enables increased power consumption saving and speeding up of operations to be achieved.

[Third Embodiment]

Figure 11:
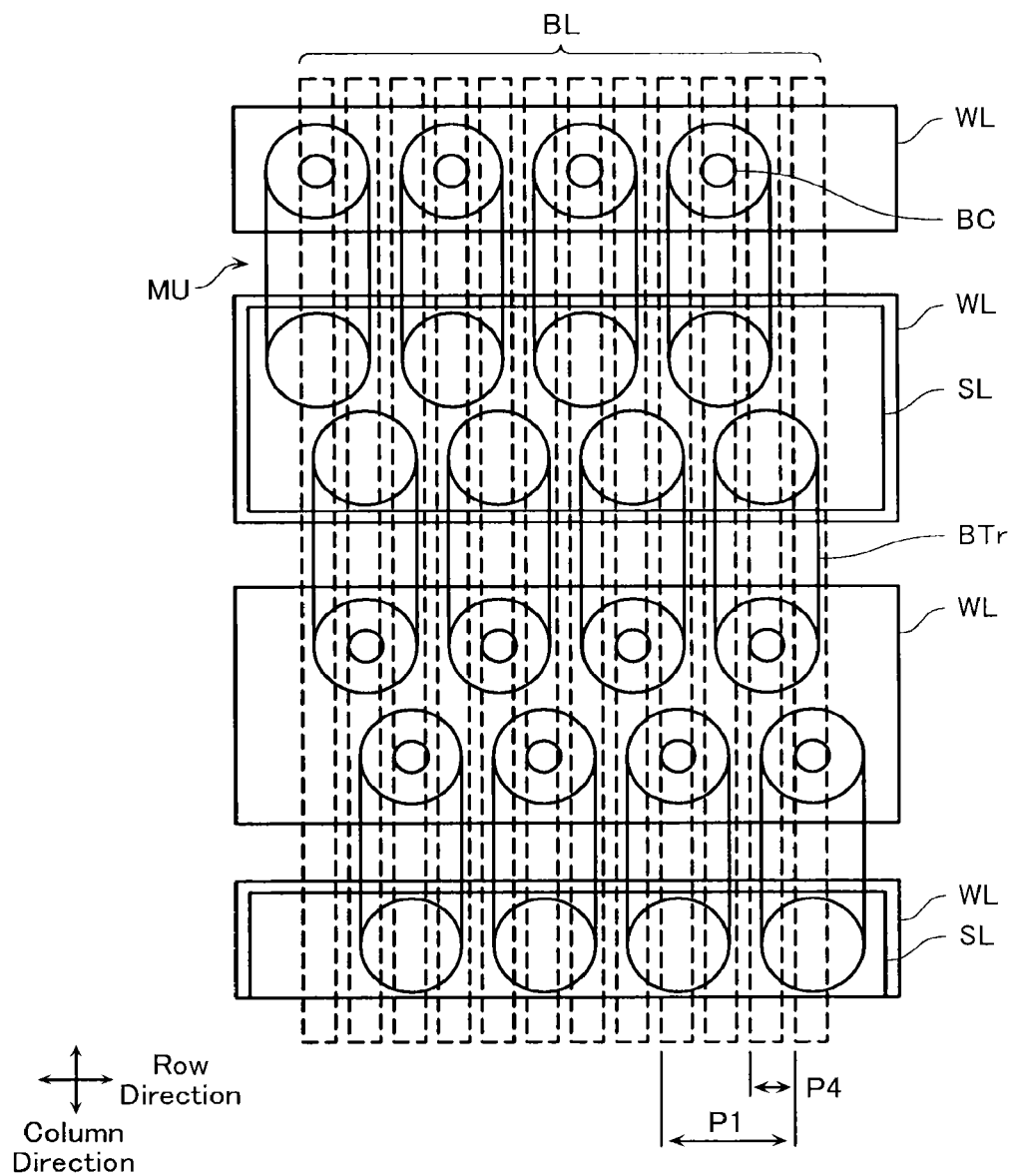
FIG. 11 is a plan view of part of a memory cell array in a semiconductor memory device according to a third embodiment.

FIG. 11 is a plan view showing part of a semiconductor memory device according to a third embodiment.

In the first and second embodiments, the memory units MU adjacent in the column direction were disposed misaligned by an increment of a half pitch in the row direction. However, in the third embodiment, the memory units MU adjacent in the column direction are disposed misaligned by an increment of a finer pitch than this, for example, a pitch P4 which is ⅓ of the pitch P1 in the row direction of the memory units MU. Such a configuration results in page length being further increased and enables further improvement in read speed.

[Fourth Embodiment]

Figure 12:
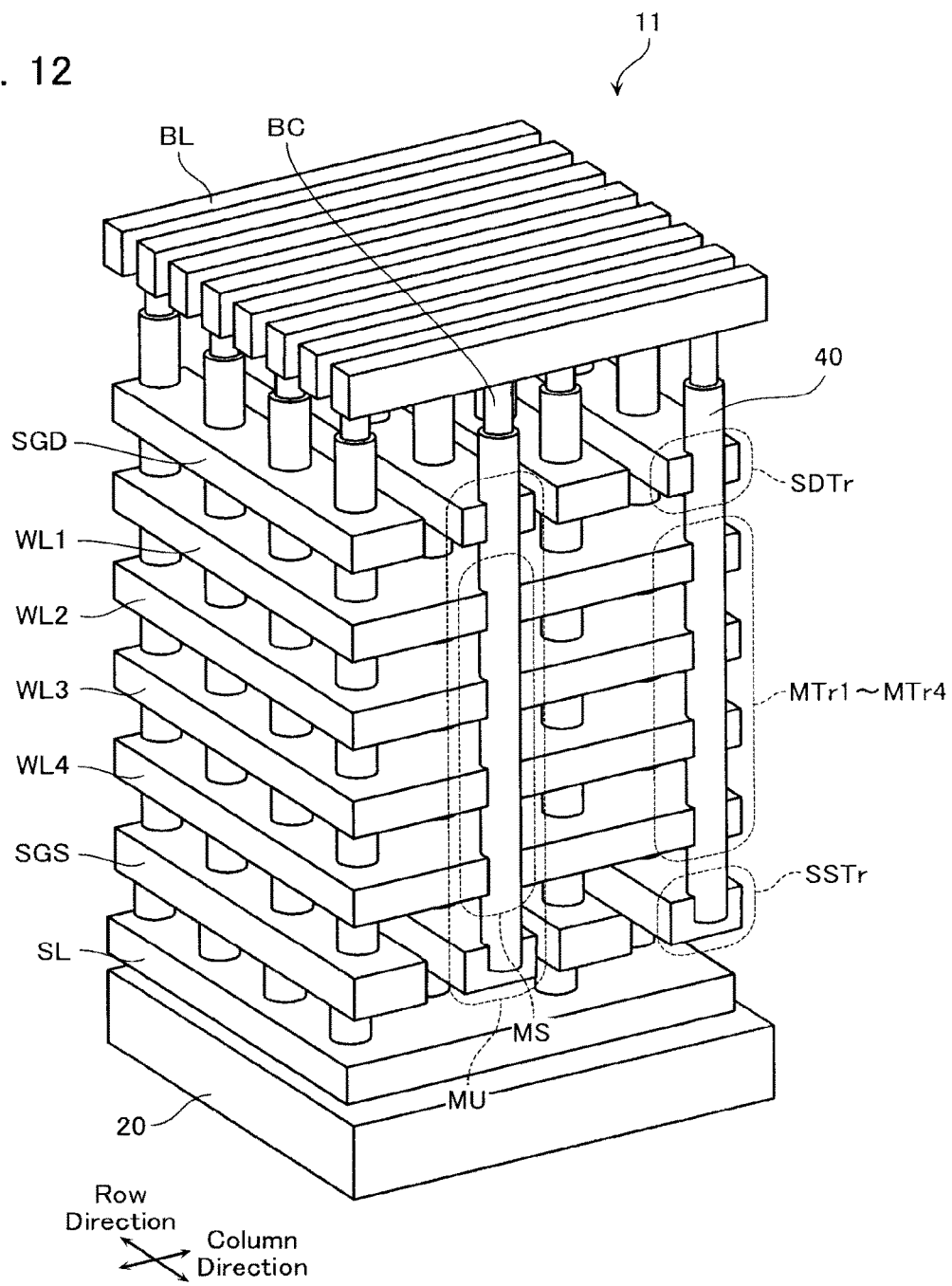
FIG. 12 is a perspective view of part of a memory cell array in a semiconductor memory device according to a fourth embodiment.

Next, a semiconductor memory device according to a fourth embodiment of the present invention is described. FIG. 12 is a perspective view showing a configuration of part of the semiconductor memory device according to the present embodiment. In the first through third embodiments, a U-shaped type semiconductor layer 30 was employed as a channel body of the memory units MU. However, in the present embodiment, a pillar type (I type) semiconductor layer 40 is employed as a channel body of the memory units MU. In such a configuration, a back gate transistor BTr is not provided, and the source line SL is disposed at a lower part of the memory string MS.

Such a configuration also has the memory units MU adjacent in the column direction displaced by ½ of the pitch in the row direction, thereby making it possible to obtain similar advantages to those of the first embodiment. Note that similarly to the third embodiment, the present embodiment also allows the memory units MU adjacent in the column direction to be configured misaligned by an increment of a finer pitch than a half pitch of the pitch in the row direction.

[Fifth Embodiment]

Figure 13:
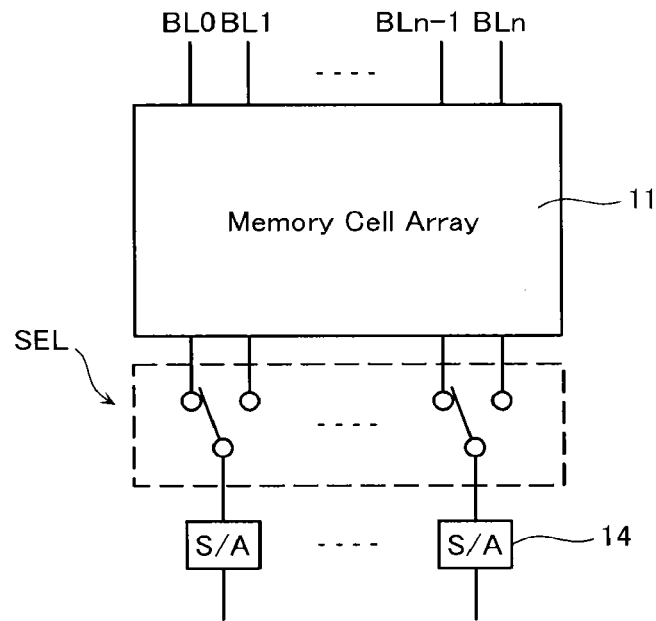
FIG. 13 is a block diagram showing a schematic configuration of a semiconductor memory device according to a fifth embodiment.

Next, a fifth embodiment is described with reference to FIG. 13. FIG. 13 is a block diagram showing a schematic configuration of a semiconductor memory device according to the present embodiment.

In the present embodiment, similarly to in the first embodiment, disposing the memory units MU staggered results in approximately two times as many bit lines BL being allocated as the number of memory units MU arranged in the row direction. In the first embodiment, the same number of sense amplifiers as the number of memory units MU in the row direction must be provided, for example. That is, the same number of sense amplifiers as bit lines BL connected to the memory units MU become necessary. However, in the present embodiment, since one sense amplifier 14 is used alternately by two bit lines BL, a selecting circuit SEL is provided between the bit lines BL and the sense amplifier 14.

In the case of this embodiment, area of the sense amplifier can be suppressed to an area similar to that in a conventional device. A sense amplifier 14 requires a greater circuit area than a select circuit. As a result, reducing a number of sense amplifiers as in the present embodiment allows increase in circuit area overall to be prevented. In order to read and write data alternately in adjacent bit lines, each of the memory units MU may be independently supplied with, respectively, the select gate lines SGS and SGD, or the select gate lines SGS and SGD may be shared by a pair of the memory units MU.

[Sixth Embodiment]

Figure 14:
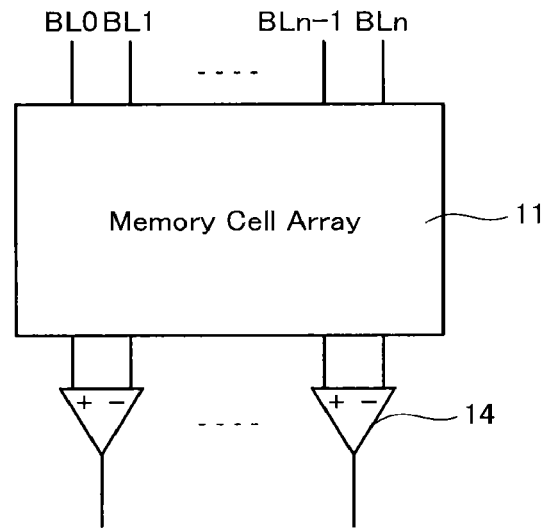
FIG. 14 is a block diagram showing a schematic configuration of a semiconductor memory device according to a sixth embodiment.

FIG. 14 is a block diagram showing a schematic configuration of a semiconductor memory device according to a sixth embodiment. A basic configuration of the present embodiment is similar to that of the first embodiment, but differs in that a differential type sense amplifier is used as the sense amplifier 14. In the present embodiment, a pair cell is configured by a pair of corresponding memory transistors MTr in memory units MU adjacent in the column direction, and this pair cell stores data that differs logically one from another. In this case, a pair of data is read from adjacent bit lines BL and differential detection is performed by the sense amplifier 14.

This embodiment allows configuration of a memory resistant to noise, disturbance, and the like.

[Seventh Embodiment]

Figure 15:
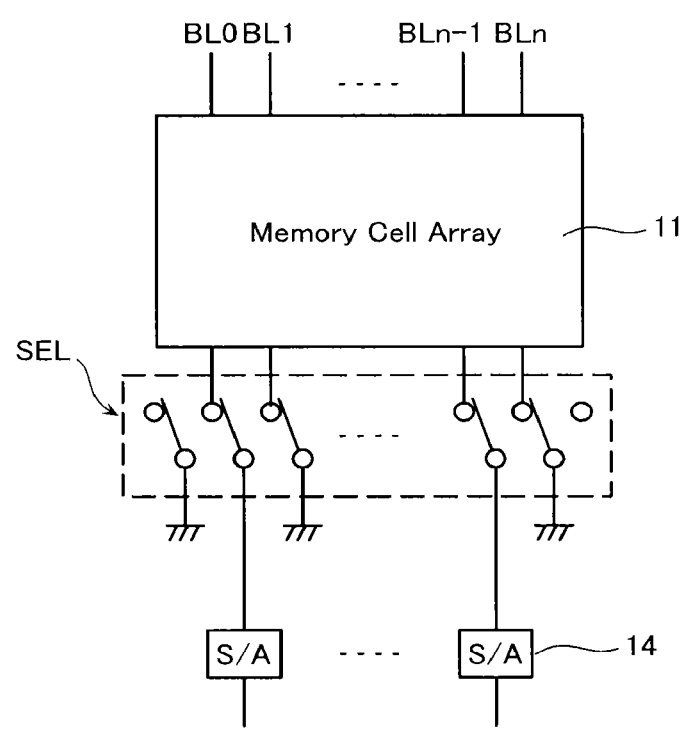
FIG. 15 is a block diagram showing a schematic configuration of a semiconductor memory device according to a seventh embodiment.

FIG. 15 is a block diagram showing a schematic configuration of a semiconductor memory device according to a seventh embodiment. In the present embodiment, one of two bit lines BL is connected to the sense amplifier 14, and the other of the two bit lines BL is grounded and used as a shield line.

The present embodiment, while setting the number of bits of a page that are read at one time to be the same as in a conventional device, allows every other bit line BL to be used as a shield, hence enables even greater stability of data read to be achieved.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of controlling a semiconductor memory device, the semiconductor memory device comprising:
   a semiconductor substrate;
   memory units including a first memory unit, a second memory unit, and a third memory unit, the second memory unit being adjacent to the first memory unit in a first direction, the third memory unit being adjacent to the first memory unit in a second direction crossing the first direction;
   a word line surrounding both a part of the first memory unit and a part of the second memory unit;
   bit lines disposed above the memory units, the bit lines extending in a third direction, the third direction being different from both the first direction and the second direction, the third direction being parallel to the semiconductor substrate;
a selecting circuit electrically connected to two bit lines; and
a sense amplifier electrically connected to the selecting circuit, the method comprising:
selecting one bit line of the two bit lines by the selecting circuit; and
accessing data via the selected bit line by the sense amplifier.

2. The method of controlling the semiconductor memory device according to claim 1, wherein
a distance between the first memory unit and the third memory unit in the third direction is smaller than a distance between the first memory unit and the second memory unit in the first direction.

3. The method of controlling the semiconductor memory device according to claim 2, wherein the sense amplifier is disposed below the memory units.

4. The method of controlling the semiconductor memory device according to claim 2, wherein the memory units are disposed between the bit lines and the sense amplifier in a stacking direction.

5. The method of controlling the semiconductor memory device according to claim 2, wherein
the bit lines are arranged in the first direction with a second pitch that is 1/n times a first pitch (where n is an integer of 2 or more), the first pitch being a distance between the first memory unit and the second memory unit, and the second pitch being a distance between a first bit line and a second bit line.

6. The method of controlling the semiconductor memory device according to claim 5, wherein the sense amplifier is disposed below the memory units.

7. The method of controlling the semiconductor memory device according to claim 2, wherein
one of the memory units comprises:
a semiconductor body extending in a direction perpendicular to the semiconductor substrate; and
a charge storage layer surrounding the semiconductor body,
the word line surrounding the charge storage layer.

8. The method of controlling the semiconductor memory device according to claim 7, wherein a width of the bit lines in the first direction is smaller than a width of the semiconductor body.

9. The method of controlling the semiconductor memory device according to claim 7, wherein the sense amplifier is disposed below the memory units.

10. The method of controlling the semiconductor memory device according to claim 9, wherein the word line surrounds a part of the third memory unit.

11. The method of controlling the semiconductor memory device according to claim 2, wherein
one of the memory units comprises:
a U-shaped semiconductor body including two semiconductor pillars and a first portion, a first end of the first portion being connected to one of the semiconductor pillars, and a second end of the first portion being connected to the other one of the semiconductor pillars.

12. The method of controlling the semiconductor memory device according to claim 2, the semiconductor memory device comprising:
a first contact electrically connected to one end of the first memory unit; and
a second contact electrically connected to one end of the second memory unit, wherein
a width of the first memory unit is larger than a width of the first contact and a width of the second memory unit is larger than a width of the second contact.

13. The method of controlling the semiconductor memory device according to claim 1, wherein the word line surrounds a part of the third memory unit.

14. A method of controlling a semiconductor memory device, the semiconductor memory device comprising:
first, second and third bit lines extending in a first direction, the second bit line being adjacent to the first bit line and the third bit line;
a first memory unit including a first select transistor, the first memory unit being electrically connected to the first bit line;
a second memory unit including a second select transistor, the second memory unit being adjacent to the first memory unit in a second direction crossing the first direction, the second memory unit being electrically connected to the second bit line;
a third memory unit including a third select transistor, the third memory unit being adjacent to the first memory unit in a third direction crossing the first direction and the second direction, the third memory unit being electrically connected to the third bit line; and
a first conductive layer connected to a gate of the first select transistor, a gate of the second select transistor and a gate of the third select transistor, the method comprising:
applying a voltage to the first conductive layer; and
accessing data via the first and third bit lines.

15. The method of controlling the semiconductor memory device according to claim 14, wherein the first conductive layer extends in the third direction.

16. The method of controlling the semiconductor memory device according to claim 14, the semiconductor memory device further comprising:
a fourth memory unit including a fourth select transistor, the fourth memory unit being electrically connected to the first bit line;
a fifth memory unit including a fifth select transistor, the fifth memory unit being adjacent to the fourth memory unit in the second direction, the fifth memory unit being electrically connected to the second bit line;
a sixth memory unit including a sixth select transistor, the sixth memory unit being adjacent to the fourth memory unit in the third direction, the sixth memory unit being electrically connected to the third bit line; and
a second conductive layer connected to a gate of the fourth select transistor, a gate of the fifth select transistor and a gate of the sixth select transistor.

17. The method of controlling the semiconductor memory device according to claim 16, wherein the first and second conductive layers extend in the third direction.

18. The method of controlling the semiconductor memory device according to claim 14, wherein the first direction is substantially perpendicular to the third direction.

19. The method of controlling the semiconductor memory device according to claim 14, the semiconductor memory device further comprising:
a selecting circuit electrically connected to the first and second bit lines.

20. The method of controlling the semiconductor memory device according to claim 14, wherein
a first pitch is larger than a second pitch, the first pitch being a distance between the first memory unit and the second memory unit, the second pitch being a distance between the first bit line and the second bit line.

21. The method of controlling the semiconductor memory device according to claim 14, wherein the first memory unit comprises:
a U-shaped semiconductor body including two semiconductor pillars and a first portion, a first end of the first portion being connected to one of the semiconductor pillars, a second end of the first portion being connected to the other of the semiconductor pillars.

22. The method of controlling the semiconductor memory device according to claim 14, the semiconductor memory device further comprising:
a substrate; and
a sense amplifier circuit provided between the first memory unit and the substrate.

23. The method of controlling the semiconductor memory device according to claim 14, wherein
the first memory unit further includes a first memory transistor;
the second memory unit further includes a second memory transistor;
the third memory unit further includes a third memory transistor; and
a gate of the first memory transistor, a gate of the second memory transistor, and a gate of the third memory transistor are connected to a third conductive layer, the third conductive layer extending in the third direction.

24. A method of controlling a semiconductor memory device, the semiconductor memory device comprising:
a substrate, a surface of the substrate being parallel to a first direction and a second direction and perpendicular to a third direction;
first, second, and third bit lines extending in the first direction, the second bit line being adjacent to the first bit line and the third bit line;
a first memory unit including a first select transistor, the first memory unit being electrically connected to the first bit line;
a second memory unit including a second select transistor, the second memory unit being adjacent to the first memory unit in a fourth direction crossing the first direction and the second direction, the second memory unit being electrically connected to the second bit line;
a third memory unit including a third select transistor, the third memory unit being adjacent to the first memory unit in the second direction, the third memory unit being electrically connected to the third bit line; and
a first conductive layer connected to a gate of the first select transistor, a gate of the second select transistor and a gate of the third select transistor, the method comprising:
applying a voltage to the first conductive layer; and
accessing data via the first and third bit lines.

25. The method of controlling the semiconductor memory device according to claim 24, wherein the first conductive layer extends in the second direction.

26. The method of controlling the semiconductor memory device according to claim 24, the semiconductor memory device further comprising:
a fourth memory unit including a fourth select transistor, the fourth memory unit being electrically connected to the first bit line;
a fifth memory unit including a fifth select transistor, the fifth memory unit being adjacent to the fourth memory unit in the fourth direction, the fifth memory unit being electrically connected to the second bit line;
a sixth memory unit including a sixth select transistor, the sixth memory unit being adjacent to the fourth memory unit in the second direction, the sixth memory unit being electrically connected to the third bit line; and
a second conductive layer connected to a gate of the fourth select transistor, a gate of the fifth select transistor and a gate of the sixth select transistor.

27. The method of controlling the semiconductor memory device according to claim 26, wherein the first and second conductive layers extend in the second direction.

28. The method of controlling the semiconductor memory device according to claim 24, wherein the first direction is substantially perpendicular to the second direction and the third direction, and the second direction is substantially perpendicular to the third direction.

29. The method of controlling the semiconductor memory device according to claim 24, the semiconductor memory device further comprising:
a selecting circuit electrically connected to the first and second bit lines.

30. The method of controlling the semiconductor memory device according to claim 24, wherein
a first pitch is larger than a second pitch, the first pitch being a distance between the first memory unit and the second memory unit, the second pitch being a distance between the first bit line and the second bit line.

31. The method of controlling the semiconductor memory device according to claim 24, wherein the first memory unit comprises:
a U-shaped semiconductor body including two semiconductor pillars and a first portion, a first end of the first portion being connected to one of the semiconductor pillars, a second end of the first portion being connected to the other of the semiconductor pillars.

32. The method of controlling the semiconductor memory device according to claim 24, the semiconductor memory device further comprising:
a sense amplifier circuit provided between the first memory unit and the substrate.

33. The method of controlling the semiconductor memory device according to claim 24, wherein
the first memory unit further includes a first memory transistor;
the second memory unit further includes a second memory transistor;
the third memory unit further includes a third memory transistor; and
a gate of the first memory transistor, a gate of the second memory transistor and a gate of the third memory transistor are connected to a third conductive layer, the third conductive layer extending in the second direction.

* * * * *